(12) United States Patent
Juang et al.

(10) Patent No.: US 8,269,539 B2
(45) Date of Patent: Sep. 18, 2012

(54) METHOD FOR CALIBRATING AND CONTROLLING SIGNAL SLEW RATE, AND OUTPUT STAGE USING THE SAME

(75) Inventors: Kai-Cheung Juang, Nantou (TW); Hsin-Hong Hou, Zhonghe (TW); Yung-Pin Lee, Zhonghe (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 12/971,617

(22) Filed: Dec. 17, 2010

(65) Prior Publication Data

US 2011/0156764 A1 Jun. 30, 2011

(30) Foreign Application Priority Data

Dec. 30, 2009 (TW) ................................ 98145751 A

(51) Int. Cl.
*H03K 5/12* (2006.01)
(52) U.S. Cl. ............................ 327/170; 327/35; 327/175
(58) Field of Classification Search .................... 327/31, 327/35–36, 170–175
See application file for complete search history.

(56) References Cited

U.S. PATENT DOCUMENTS

| | | | |
|---|---|---|---|
| 6,847,244 B2 * | 1/2005 | Pillay et al. | 327/174 |
| 7,038,512 B2 * | 5/2006 | Wilson et al. | 327/170 |

* cited by examiner

*Primary Examiner* — An Luu
(74) *Attorney, Agent, or Firm* — Wang Law Firm, Inc.; Li K. Wang; Stephen Hsu

(57) ABSTRACT

An output stage configured to control a driving voltage thereof is provided. The output stage includes: a first switching current module, coupled to a node for outputting a first current; a second switching current module, coupled to the node for outputting a second current; a switching capacitor module with a capacitance, coupled to the node; a calibrating control circuit, for calibrating the first current, the second current and the capacitance; a time constant calibrating circuit, for generating a reference slew rate, and controlling the calibrating control circuit to selectively calibrate the first current, the second current and the capacitance, such that a ratio of the first current and the capacitance and the ratio of the second current and the capacitance conform to the reference slew rate; and a voltage clamper for setting a high/low voltage range and limiting a amplitude of the driving voltage within the high/low voltage range.

7 Claims, 6 Drawing Sheets

METHOD FOR CALIBRATING AND CONTROLLING SIGNAL SLEW RATE, AND OUTPUT STAGE USING THE SAME

CROSS REFERENCE TO RELATED APPLICATION

This application claims priority of Taiwan Patent Application No. 098145751, filed on Dec. 30, 2009, the entirety of which is incorporated by reference herein.

BACKGROUND OF THE INVENTION

1. Field of the Invention

The present invention relates to an output stage, and in particular relates to an output stage for controlling slew rate and voltage level.

2. Description of the Related Art

An output stage implemented in a chip is a common interface circuit, which is like a buffer device between core circuits of the chip and external circuits or other chips. The output stage can eliminate negative effect caused by interference from loads outside of the chip. Generally, the output stage has a good self-protection mechanism and only an appropriate amount of current driving ability. However, loads driven by the output stage may vary sharply. Even so, an output waveform with high accuracy is still necessary. Therefore, an improved output stage is required.

FIG. 1 is a diagram showing a conventional device for controlling the slew rate of an output signal. In FIG. 1, an input signal is input to the slew rate control logic 11 and output from a plurality of inverters such as inverter 12. The high voltage level VIH and low voltage level VIL can be programmed by the first programmable regulator 13 and the second programmable regulator 14. The inverters 12 are not ideal switching elements and they have particular on-resistances which will affect the transition time of a logic level, i.e. the slew rate of the logic level. However, arranging parallel inverters may vary on-resistances; thereby changing the slew rate of the output signal.

When loads driven by the output signal vary, the voltage provided by the first programmable regulator 13 or the second programmable regulator 14 will be different from to voltage applied to loads. In order to reduce the voltage differences between the loads and the programmable regulators, the sizes of the inverters have to be increased. Unfortunately, the size increments of the inverters magnify parasitical capacitances in the circuit such that the operative speed of the device is lowered. Additionally, the on-resistances of the inverters will cause non-linear effect due to different load voltages such that the waveform of the output signal is distorted. Moreover, waveform distortion of the output signal results when controlling dead time of a PMOS and an NMOS.

BRIEF SUMMARY OF INVENTION

A detailed description is given in the following embodiments with reference to the accompanying drawings.

In one embodiment, the disclosure provides an output stage configured to control a driving voltage thereof according to an input signal. The output stage comprises: a first switching current module, coupled to a node for outputting a first current; a second switching current module, coupled to the node for outputting a second current; a switching capacitor module with a capacitance, coupled to the node; a calibrating control circuit, for calibrating, the first current, the second current and the capacitance; a time constant calibrating circuit, for generating a reference slew rate according to a fixed voltage source and a fixed time source, and controlling the calibrating control circuit to selectively calibrate the first current, the second current and the capacitance, such that a ratio of the first current and the capacitance and the ratio of the second current and the capacitance conform to the reference slew rate; and a voltage clamper for setting a high/low voltage range and limiting a amplitude of the driving voltage within the high/low voltage range.

In another embodiment, the disclosure provides a signal control method used in an output stage of an electronic device. The method comprises: generating a reference slew rate by a time constant calibrating circuit of the output stage according to a fixed voltage source and a time source; calibrating a switching current module of the output stage to obtain a calibrated current value and/or calibrating a switching capacitor module of the output stage to obtain a calibrated capacitance value by the time constant calibrating circuit according to the reference slew rate, such that a ratio of the calibrated current value and the calibrated capacitance value conforms to the reference slew rate; adjusting an output current value of the switching current module according to the calibrated current value and adjusting an output capacitance value of the switching capacitor module according to the calibrated capacitance value by the output stage to produce a voltage signal; providing the voltage signal to a voltage clamper, setting a high/low voltage range such that amplitude of the voltage signal is limited within the high/low voltage range by the voltage clamper; and outputting the driving voltage to loads through an isolating circuit. Additionally, when the output current value and the capacitance value changes, a slew rate of the voltage signal also correspondingly changes; and the high/low voltage range of the voltage clamper is correspondingly set according to the amplitude of the voltage signal.

A driving signal is stably output with accurate slew rate and voltage level according to different loads using the output stage, method for calibrating and controlling signal slew rate, and method for controlling signal amplitude of the disclosure. The output stage and the methods can be used in any device which needs accurate output waveforms and can be used for long distance wired communications needing large driving capacities.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
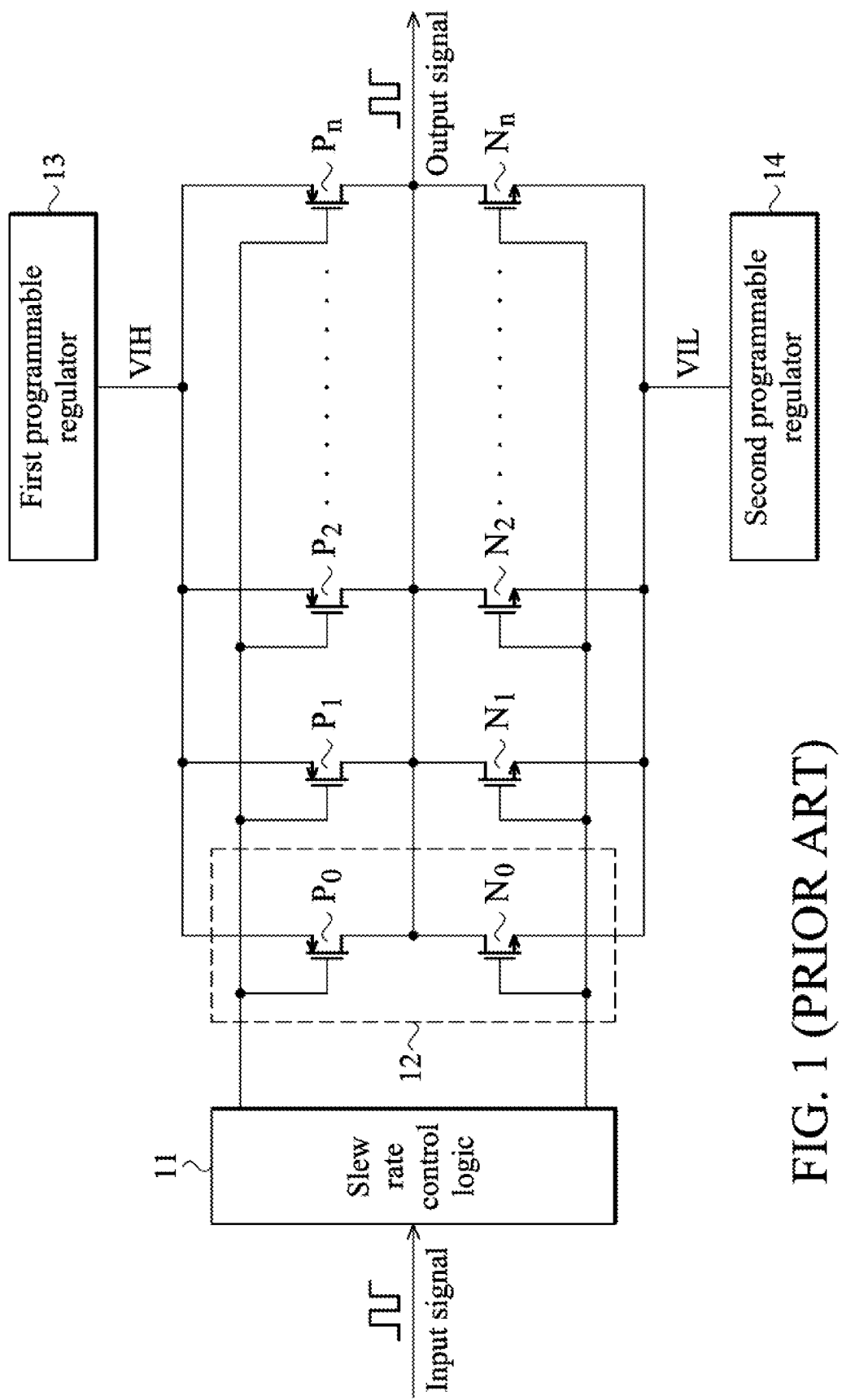
FIG. 1 is a diagram showing a conventional device for controlling the slew rate of an output signal.
Figure 2:
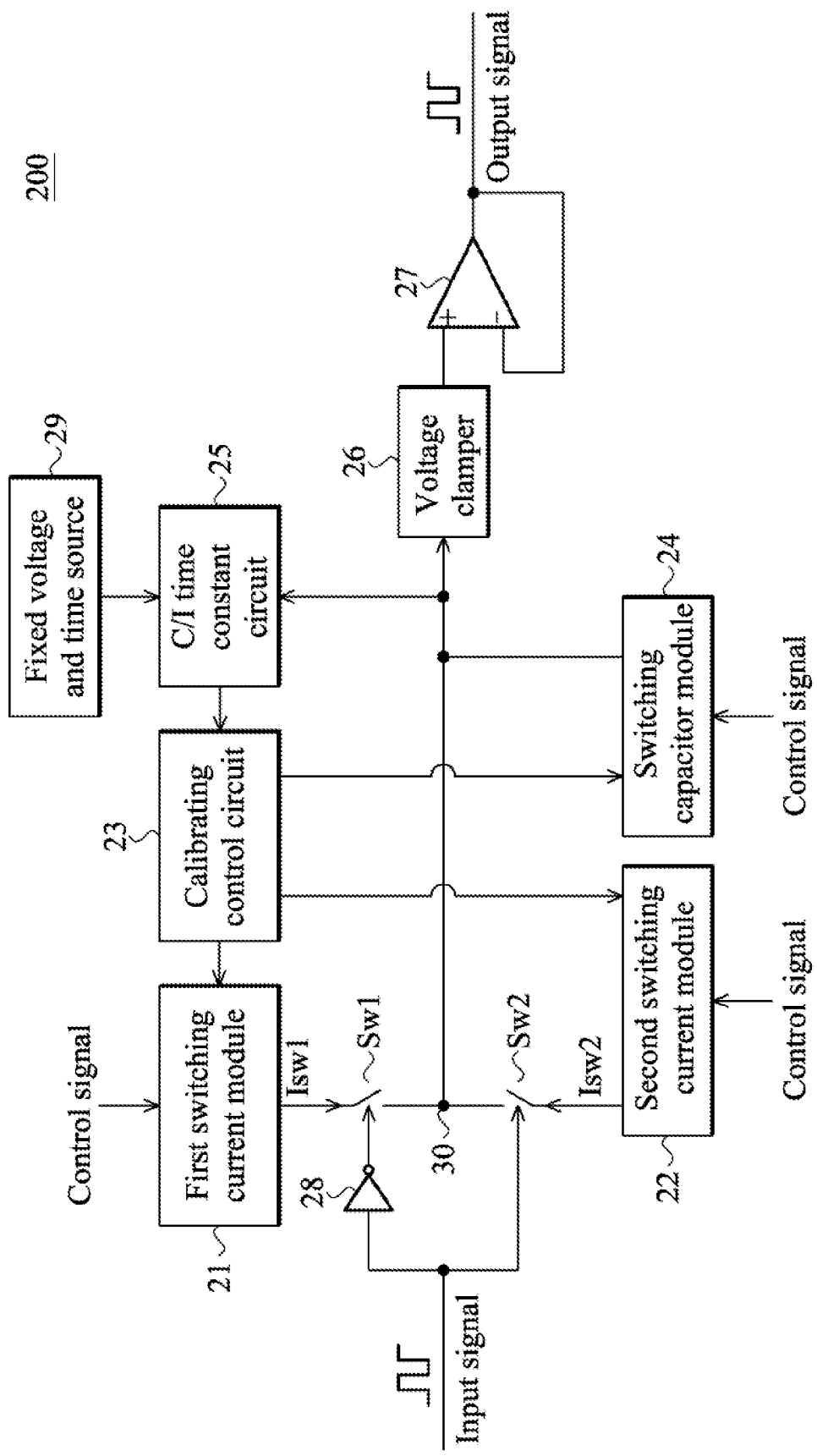
FIG. 2 is a diagram showing an output stage for controlling signal slew rate and amplitude according to an embodiment.

FIG. 2 is a diagram showing an output stage for controlling signal slew rate and amplitude according to an embodiment. In one embodiment, a test device which outputs a test signal to a device under test is taken as an example. Therefore, the so-called input signal is the test signal output from the test device. The so-called output signal is the signal under test input into the device under test, wherein a slew rate and voltage level thereof is regulated by the output stage. Additionally, the internal voltage is a voltage at node 30 of FIG. 2.

The output stage 200 includes a first switching current module 21, a second switching current module 22, a calibrating control circuit 23, a switching capacitor module 24, a C/I time constant calibrating circuit 25, a voltage clamper 26, an isolating circuit 27, an inverter 28 and a fixed voltage and time source 29.

The first switching current module 21 is connected to a first input terminal of a first switch Sw1. The first output terminal of the first switch Sw1 is connected to a node 30, and the control terminal of the first switch Sw1 is connected to the output terminal of the inverter 28. The second switching current module 22 is connected to the second input terminal of the second switch Sw2. The second output terminal of the second switch Sw2 is connected to the node 30, and the first control terminal is connected to receive the input signal. The switching capacitor module 23 is connected to the node 30. The calibrating control circuit 23 is connected to the first switching current module 21, the second switching current module 22, and the switching capacitor module 24. The Cu time constant calibrating circuit 25 is connected to the node 30 and the calibrating control circuit 23. The input terminal of the voltage clamper 26 is connected to the node 30, and the output terminal of the voltage clamper 26 is connected to the isolating circuit 27.

The input signal which is directly delivered to the second switch Sw2 and indirectly to the first switch Sw1 through an inverter 28 is used to control switches Sw1 and Sw2. The C/I time constant calibrating circuit 25 may generate a reference slew rate according to a reference clock in an electronic system and a stable voltage reference source produced by semiconductor energy levels (i.e. a fixed voltage and time source 29). The slew rate is defined as a transient voltage variation rate per a time unit, i.e. dv/dt. In other words, the slew rate can be expressed as I/C (a ratio of current and capacitance). The fixed time and voltage source 29 is highly accurate, so that the slew rate of the driving voltage of the output stage can be calibrated accurately according to the reference slew rate. That is, capacitance value and current value associated with the driving voltage of the output stage can be calibrated to conform to the reference slew rate. Finally, the slew rate of the driving voltage may be regulated or controlled according to the capacitance value and the current value.

In the embodiment of the FIG. 2, The C/I time constant calibrating circuit 25 may generate a reference slew rate according to the fixed voltage and time source 29. The C/I time constant calibrating circuit 25 controls a first current $I_{SW1}$ from the first switching current module 21 and a second current $I_{SW2}$ from the second switching current module 22, or changes the capacitance of the switching capacitor module 24 by controlling the calibrating control circuit 23 such that the ratio of the first current $I_{SW1}$ and the capacitance value or the ratio of the second current $I_{SW2}$ and the capacitance value conform to the reference slew rate.

Generally speaking, the voltage level of the output signal should be lower than the supplied voltage of the system. In order to reach a required voltage of the output signal, the voltage clamper 26 is used to control the voltage level of the output signal. The voltage clamper 26 may limit the voltage level of the output signal according to a high-level limit and a low-level limit preset by the voltage clamper 26. In another embodiment, the output terminal of the voltage clamper 26 may be connected to an isolating circuit 27, such as a follower made up of an operational amplifier, which is used to buffer the driving voltage of the output stage and insulate the output stage from loads such that loads will not affect the quality of the driving voltage.

Figure 3:
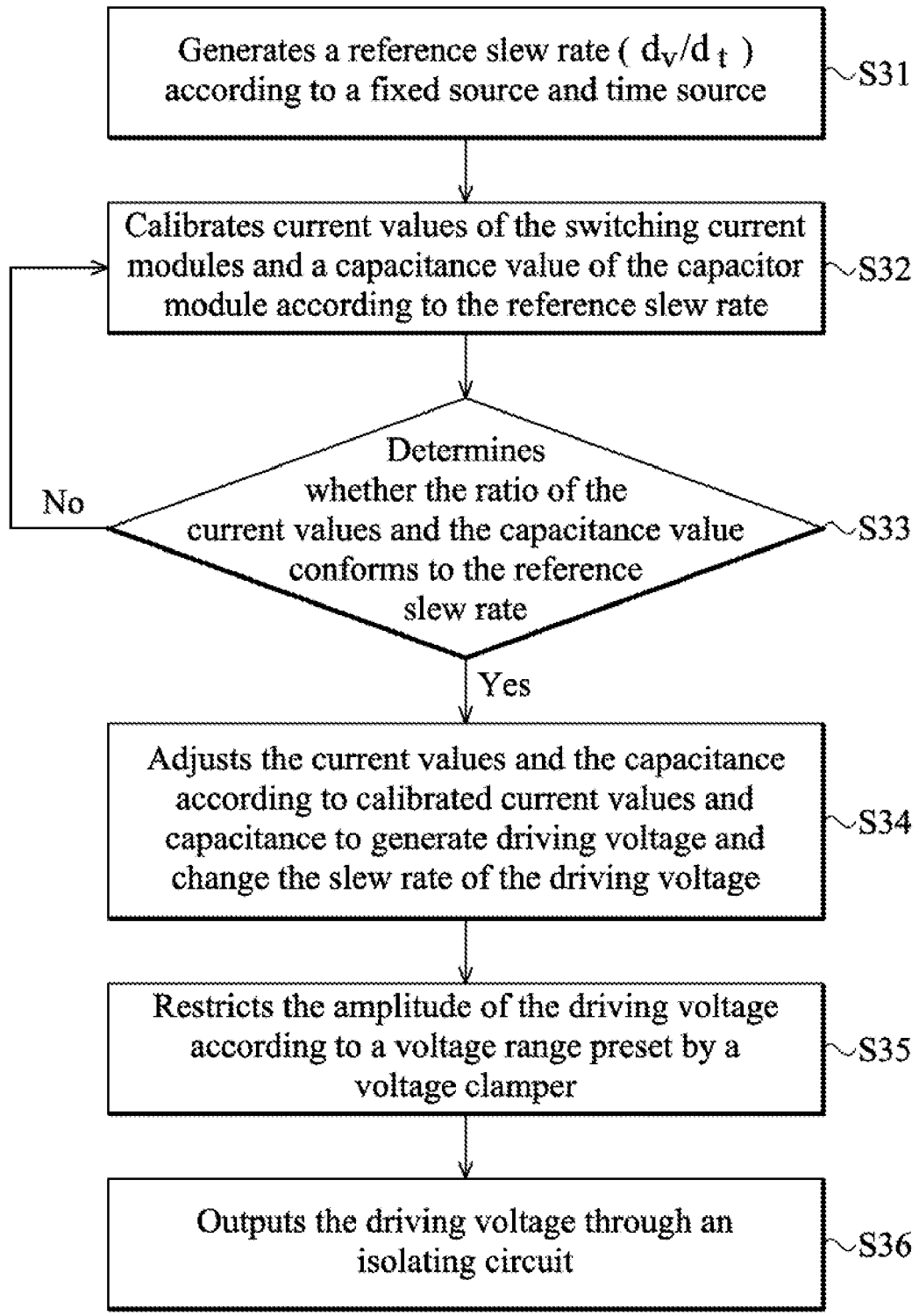
FIG. 3 is a flow chart illustrating a method for controlling a signal according to an embodiment.

FIG. 3 is a flow chart illustrating a method for controlling a signal according to an embodiment. In step S31, a reference slew rate is generated according to the fixed voltage and time source 29. Next, the current value of the switching current modules 21, 22 and the capacitance value of the capacitance module are calibrated according to the reference slew rate in step S32. Next, in step S33 whether the calibrated current value and the capacitance conform to the reference slew rate is determined. If not, the step S32 is performed, wherein the current values of the switching current module 21, 22 and the capacitance of the capacitance module 24 are calibrated again until the current values and the capacitance value conform to the reference slew rate. If yes, the step S34 is performed, wherein the switching current module 21, 22, and the switching capacitor module are adjusted to produce the driving voltage and the slew rate of the driving voltage is changed at the same time. In step S35, the driving voltage is restricted to a voltage range. Finally, in step S36, the driving voltage is output through the isolating circuit 27. It is noted that calibrating the slew rate is different from controlling/adjusting the slew. The method for calibrating the slew rate will be detailed below.

The C/I time constant calibrating circuit 25 may set a voltage time variation rate dv/dt (i.e. slew rate) according to an accurate time source and clock source. The voltage time variation rate can be equivalent to a ratio of the capacitance and current. Next, the C/I time constant calibrating circuit 25 controls the first switching current module 21 and second switching current module 22 to change the first current $I_{SW1}$ and/or the second current $I_{SW2}$ and the capacitance of the switching capacitor module 24. In one embodiment, the capacitance of the switching capacitor module 24 is fixed, so that the first current $I_{SW1}$ and/or the second current $I_{SW2}$ are changed to calibrate the slew rate of the driving voltage. The C/I time constant calibrating circuit 25 may measure the voltage produced by charging the capacitor with the first current $I_{SW1}$ and the second current $I_{SW2}$ so as to determine whether the ratio of the first current $I_{SW1}$ and the capacitance, and the ratio of the second current $I_{SW2}$ and the capacitance conform to the reference slew rate. If not, the first current $I_{SW1}$ and/or the second current $I_{SW2}$ are changed again until the ratio of the first current $I_{SW1}$ and the capacitance, and the ratio of the second current $I_{SW2}$ and the capacitance conform to the reference slew rate.

In another embodiment, the capacitance of the switching capacitor module 24 may also be changed. That is, the capacitance of the switching capacitor module 24, the first current $I_{SW1}$ and the second current $I_{SW2}$ are changed to calibrate the slew rate of the driving voltage. The C/I time constant circuit 25 may measure the voltage produced by charging the capacitor with the first current $I_{SW1}$ and the second current $I_{SW2}$ so as to determine whether the ratio of the first current $I_{SW1}$ and the capacitance, and the ratio of the second current $I_{SW2}$ and the capacitance conform to the slew rate. If not, the capacitance, the first current $I_{SW1}$ and/or the second current $I_{SW2}$ are changed again until the ratio of the first current $I_{SW1}$ and the capacitance, and the ratio of the second current $I_{SW2}$ and the capacitance conform to the slew rate. Similarly, in another embodiment, the first current $I_{SW1}$ and the second current $I_{SW2}$ are fixed. The capacitance of the switching capacitor 24 may be changed to calibrate to the slew rate of the driving voltage to conform to the reference slew rate.

Figure 4A:
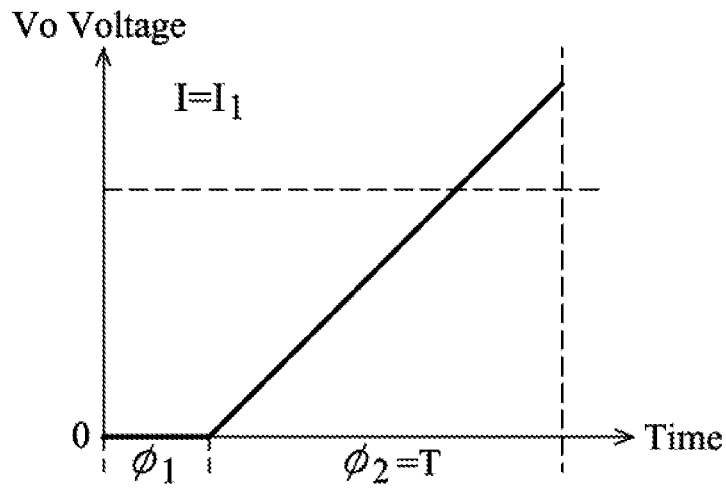
FIGS. 4a to 4c are diagrams showing the calibration operation of a capacitance/current time constant calibrating device of FIG. 2.
Figure 4B:
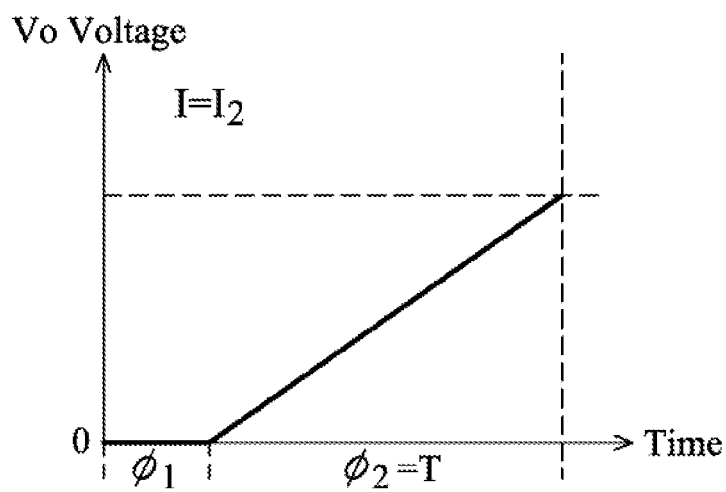
Figure 4C:
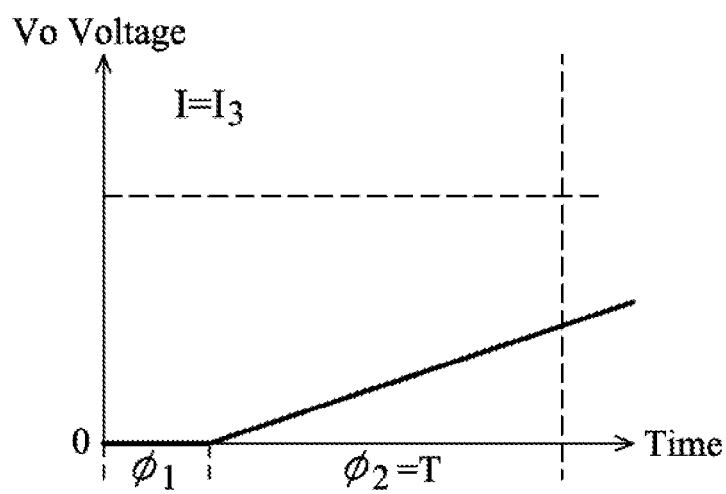

FIGS. 4a to 4c are diagrams showing the calibration operation of a C/I time constant calibrating device of FIG. 2. The slew rate is set as $V_{ref}/T$. φ1 is the time to set the node 30 of FIG. 2 to zero volt for capacitor charge initial point and φ2 is the capacitor charge interval within a fixed timeframe. In the FIG. 4a, the current value of the current source is $I_1$, and the conducted time of the switch Sw2 is T. After T, the voltage is larger than the predetermined voltage $V_{ref}$. It is understood that the current $I_1$ is too large. In the FIG. 4b. the current value of the current source is $I_2$, and the conducted time of the switch Sw2 is T. After T, the voltage is equal to the predetermined voltage V. It is understood that the current $I_2$ is the current that is required. In the FIG. 4c, the current value of the current source is $I_3$ and the conducted time of the switch Sw2 is T. After T, the voltage is smaller than the predetermined voltage $V_{ref}$. Therefore, the current $I_3$ is too small.

Figure 5A:
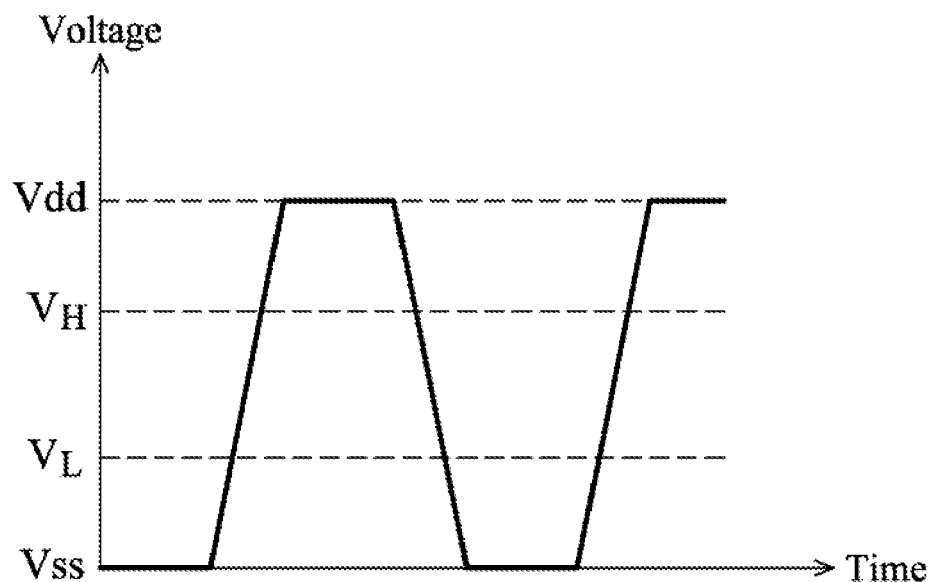
FIG. 5a is a waveform diagram showing a low slew rate of an output signal.

Please refer to FIGS. 5a to 5d. FIG. 5a is a waveform diagram showing a low slew rate of an output signal. The first current $I_{SW1}$ of the first switching current module 21 and the second current $I_{SW2}$ of the second switching current module 22 are reduced, and the capacitance of the switching capacitor module 24 is increased. It should be noted that the first current $I_{SW1}$ and the capacitance may determine the rising time of the driving voltage. The second $I_{SW2}$ and the capacitance may determine the falling time of the driving voltage. In the embodiment, the first current $I_{SW1}$ and the second current $I_{sw2}$ are similar. In another embodiment, the first current. $I_{SW1}$ and the second current $I_{SW2}$ may be different. Furthermore, to control the first switch Sw1 and the second switch Sw2, the ?? can determine a transition point (from a low level turn to a high level or from a high level turn to a low level), i.e. to control the switches the frequency of the driving voltage can be determined.

Figure 5B:
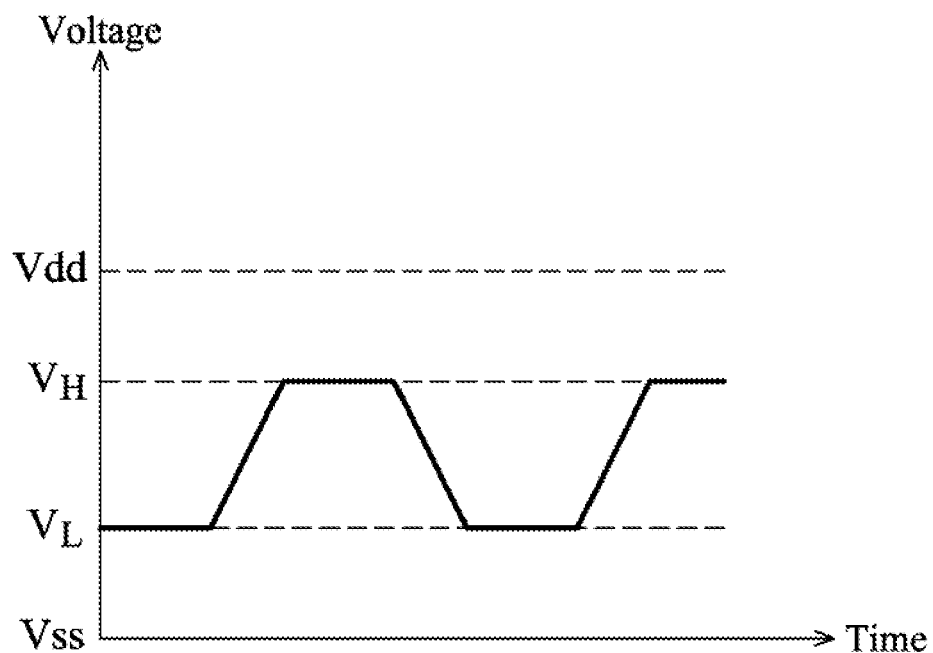
FIG. 5b is a waveform diagram of an output signal of FIG. 5a clamped by a voltage clamper.

FIG. 5b is a waveform diagram of an output signal of FIG. 5a clamped by a voltage clamper. The voltage clamper is used to restrict the high voltage level and the low voltage level of the driving voltage.

Figure 5C:
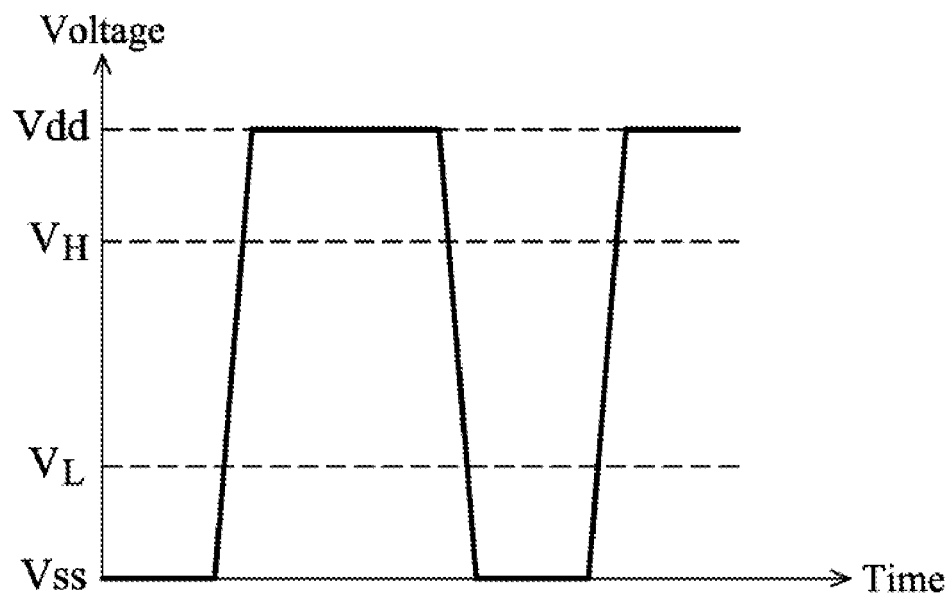
FIG. 5c is a waveform diagram showing high slew rate of an output signal.
Figure 5D:
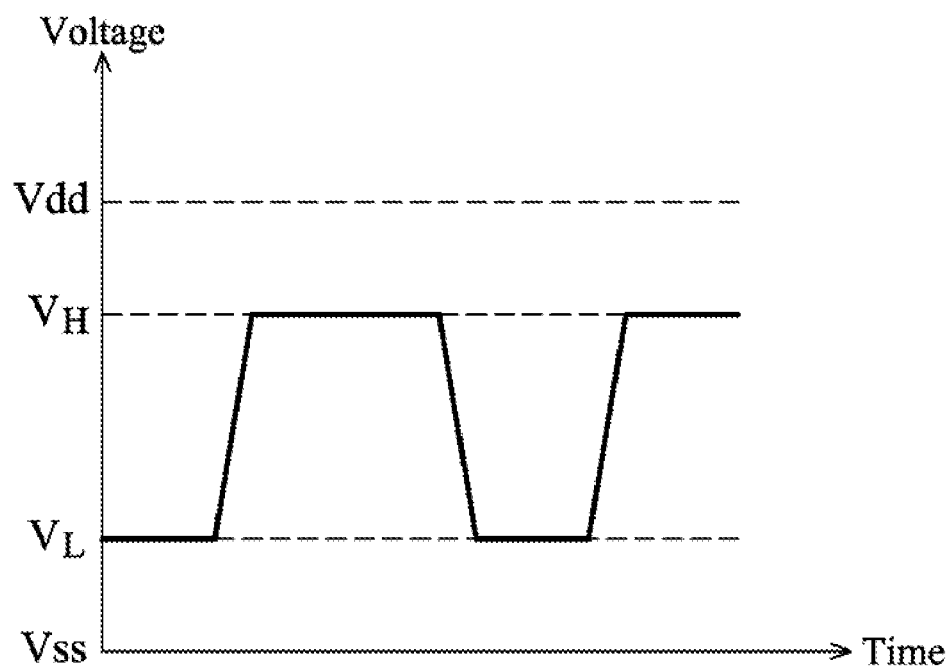
FIG. 5d is waveform diagram of an output signal of FIG. 5c clamped by a voltage clamper.

FIG. 5c is a waveform diagram showing a high slew rate of an output signal. The first current $I_{SW1}$ of the first switching current module 21 and the second current $I_{SW2}$ of the second switching current module 22 are increased, and the capacitance of the switching capacitor module 24 is decreased. It should be noted that the first current $I_{SW1}$ and the capacitance may determine the rising time of the driving voltage. The second $I_{SW2}$ and the capacitance may determine the falling time of the driving voltage. In the embodiment, the first current $I_{SW1}$ and the second current $I_{SW2}$ are similar. In another embodiment, the first current $I_{SW1}$ and the second current $I_{SW2}$ may be different. Furthermore, to control the first switch Sw1 and the second switch Sw2, the switches can determine a transition interval (from a low level to a high level or from a high level to a low level), i.e. the frequency of the driving signal can be determined by the switches transition time. FIG. 5d is waveform diagram of an output signal of FIG. 5c clamped by a voltage clamper.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output stage configured to control a driving voltage thereof according to an input signal, comprising:
    a first switching current module, coupled to a node for outputting a first current;
    a second switching current module, coupled to the node for outputting a second current;
    a switching capacitor module with a capacitance, coupled to the node;
    a calibrating control circuit, for calibrating, the first current, the second current and the capacitance;
    a time constant calibrating circuit, for generating a reference slew rate according to a fixed voltage source and a fixed time source, and controlling the calibrating control circuit to selectively calibrate the first current, the second current and the capacitance, such that a ratio of the first current and the capacitance, and a ratio of the second current and the capacitance conform to the reference slew rate; and
    a voltage clamper for setting a high/low voltage range and limiting an amplitude of the driving voltage within the high/low voltage range.

2. The output stage as claimed in claim 1, further comprising:
    an inverter, for generating an inverted input signal;
    a first switch, having a first input terminal coupled to the first switching current module, a first output terminal coupled to the node, and a first control terminal receiving the inverted input signal; and
    a second switch, having a second input terminal coupled to the second switching current module, a second output terminal coupled to the node, and a second control terminal receiving the input signal,
    wherein the first switch is operative according to the inverted input signal, and the second switch is operative according to the input signal, thereby controlling the frequency of the driving voltage.

3. The output stage as claimed in claim 2, further comprising an isolating circuit for buffering the driving voltage and insulating the driving voltage from loads.

4. The output stage as claimed in claim 1, wherein the time constant calibrating circuit couples to the node and measures the driving voltage produced by charging and discharging the switching capacitor module with the first current or the second current within a specific timeframe.

5. A signal control method, used in an output stage of an electronic device, the method comprising:
    generating a reference slew rate by a time constant calibrating circuit of the output stage according to a fixed voltage source and a time source;
    calibrating a switching current module of the output stage to obtain a calibrated current value and/or calibrating a switching capacitor module of the output stage to obtain a calibrated capacitance value by the time constant calibrating circuit according to the reference slew rate, such that a ratio of the calibrated current value and the calibrated capacitance value conforms to the reference slew rate;

adjusting an output current value of the switching current module according to the calibrated current value and adjusting an output capacitance value of the switching capacitor module according to the calibrated capacitance value by the output stage to produce a voltage signal;

providing the voltage signal to a voltage clamper;

setting a high/low voltage range such that amplitude of the voltage signal is limited within the high/low voltage range by the voltage clamper, and outputting the driving voltage to loads through an isolating circuit, wherein when the output current value and the capacitance value changes, a slew rate of the voltage signal also correspondingly changes, and wherein the high/low voltage range of the voltage clamper is correspondingly set according to the amplitude of the voltage signal.

6. The method as claimed in claim 5, wherein the output current charges and discharges the switching capacitor module to produce the driving voltage.

7. The method as claimed in claim 5, wherein the switching current module comprises a first switching current module and a second switching current module.

* * * * *